(12) United States Patent
Jung et al.

(10) Patent No.: US 9,576,623 B2
(45) Date of Patent: Feb. 21, 2017

(54) SENSE AMPLIFIER AND SEMICONDUCTOR MEMORY DEVICE EMPLOYING THE SAME

(71) Applicant: Industry-Academic Cooperation Foundation, Yonsei University, Seoul (KR)

(72) Inventors: Seongook Jung, Seoul (KR); Hanwool Jeong, Seoul (KR); Young Hwi Yang, Seoul (KR); Kyoman Kang, Gunpo-si (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 14/974,374

(22) Filed: Dec. 18, 2015

(65) Prior Publication Data
US 2016/0181993 A1    Jun. 23, 2016

(30) Foreign Application Priority Data
Dec. 22, 2014   (KR) .................. 10-2014-0185798

(51) Int. Cl.
| | | |
|---|---|---|
| G11C 7/12 | (2006.01) | |
| G11C 7/06 | (2006.01) | |
| G11C 7/08 | (2006.01) | |
| G11C 11/4091 | (2006.01) | |
| G11C 7/10 | (2006.01) | |
| G11C 11/419 | (2006.01) | |

(52) U.S. Cl.
CPC ............ *G11C 7/12* (2013.01); *G11C 7/067* (2013.01); *G11C 7/062* (2013.01); *G11C 7/065* (2013.01); *G11C 7/1048* (2013.01); *G11C 11/4091* (2013.01); *G11C 11/419* (2013.01)

(58) Field of Classification Search
CPC ....... G11C 7/067; G11C 7/12; G11C 11/4091; G11C 11/419; G11C 7/1048; G11C 7/065; G11C 7/062
USPC .................................................. 365/203, 205
See application file for complete search history.

(56) References Cited

U.S. PATENT DOCUMENTS 4,239,994 A * 12/1980 Stewart .................. G11C 7/067
                                                                        327/57
4,434,381 A *  2/1984 Stewart .................. H03K 5/023
                                                                        327/51
(Continued)

FOREIGN PATENT DOCUMENTS

JP         H06162776 A      6/1994
KR      20070084785 A       8/2007

OTHER PUBLICATIONS

A. Antonio R. Pelella, Arthur D. Tuminaro, Ryan T. Freese and Yuen H. Chan, "A 8Kb Domino Read SRAM with Hit Logic and Parity Checker," 2005, in Proc. ESSCIRC, pp. 359-362.
(Continued)

*Primary Examiner* — Ly D Pham
(74) *Attorney, Agent, or Firm* — Harness, Dickey & Pierce (57) ABSTRACT

The present disclosure herein relates to a sense amplifier and a semiconductor memory device employing the same. The sense amplifier includes an inverter including a pull-up transistor and a pull-down transistor, and a switching unit configured to change a connection relationship between the pull-up transistor and the pull-down transistor according to whether an input terminal of the inverter is precharged or a signal applied to the input terminal is sensed.

19 Claims, 5 Drawing Sheets

(56) References Cited

U.S. PATENT DOCUMENTS

| | | | | |
|---|---|---|---|---|
| 4,567,387 | A * | 1/1986 | Wacyk | G11C 7/067 327/51 |
| 4,831,593 | A * | 5/1989 | Kubota | G11C 17/16 365/104 |
| 4,845,672 | A * | 7/1989 | Watanabe | G11C 11/419 327/52 |
| 4,984,202 | A * | 1/1991 | Kawahara | G11C 5/147 365/177 |
| 5,828,610 | A | 10/1998 | Rogers et al. | |
| 6,504,761 | B2 | 1/2003 | Kai et al. | |
| 7,212,458 | B1 | 5/2007 | Takeda | |
| 7,542,352 | B1 * | 6/2009 | Kuo | G11C 16/24 365/185.18 |
| 7,570,527 | B2 | 8/2009 | Houston | |
| 2007/0115031 | A1 * | 5/2007 | Hsu | G11C 7/02 327/52 |
| 2014/0293715 | A1 | 10/2014 | Barth, Jr. et al. | |

OTHER PUBLICATIONS

S. Nalam, V. Chandra, C. Pietrzyk, R. Aitken and B. Calhoun, "Assymetric 6T SRAM with two-phase write and split bitline differential sensing for low voltage operation," in Proc. 11th Int. Symp. Quality Electronic Design (ISQED), 2010, pp. 139-146.

H. Pilo, C. Barwin, G. Braceras, C. Browning, S. Lamphier, and F. Towler, "An SRAM design in 65-nm technology node featuring read and write-assist circuits to expand operating voltage," Apr. 2007, IEEE J. Solid-State Circuits, vol. 42, No. 4, pp. 813-819.

M. Qazi, K. Stawiasz, L. Chang and A.P. Chandrakasan, "A 512 kb 8T SRAM macro operating down to 0.57 V with an AC-coupled sense amplifier and embedded data-retention-voltage sensor in 45 nm SOI CMOS," 2011, IEEE J. Solid-State Circuits, vol. 46, No. 1, pp. 85-96.

Yongsik Park et al., "Design of Positive Feedback Circuit for the High Speed Sense Amplifier," 2010, The Institute of Electronics Engineers of Korea, pp. 592-594.

* cited by examiner

SENSE AMPLIFIER AND SEMICONDUCTOR MEMORY DEVICE EMPLOYING THE SAME

CROSS-REFERENCE TO RELATED APPLICATIONS

This U.S. non-provisional patent application claims priority under 35 U.S.C. §119 of Korean Patent Application No. 10-2014-0185798, filed on Dec. 22, 2014, the entire contents of which are hereby incorporated by reference.

BACKGROUND

The present disclosure herein relates to a sense amplifier and a semiconductor memory device employing the same.

A memory such as a static random access memory (SRAM) or a dynamic random access memory (DRAM) includes a memory element array for storing data and a sense amplifier for amplifying a signal read from the memory element array into a logic level to convert the signal into a logic signal. A typical sense amplifier is provided with a precharging p-type metal oxide semiconductor (PMOS) for precharging a read bit line (RBL) and an inverter for sensing and amplifying a signal read from a memory element. In general, since a complementary metal oxide semiconductor (CMOS) inverter includes a pull-up PMOS transistor and a pull-down n-type metal oxide semiconductor (NMOS) transistor, the precharging PMOS transistor and the PMOS for sensing a signal are individually provided to the typical sense element.

However, such a sense amplifier, which individually includes a precharging PMOS and a PMOS for an inverter, is vulnerable to process variation that causes a change in characteristics (e.g., a threshold voltage) of elements of a semiconductor circuit due to variables that occur when the semiconductor circuit is manufactured. This vulnerability may cause malfunction or operation speed degradation.

SUMMARY

The present disclosure provides a sense amplifier capable of preventing operation speed degradation and malfunction of a circuit due to process variation and a semiconductor memory device employing the same.

The present disclosure also provides a sense amplifier for improving an operation speed by charging an RBL of a memory with a voltage lower than a driving voltage for an inverter while preventing malfunction that may occur due to the low voltage and a semiconductor memory device employing the same.

An embodiment of the inventive concept provides a sense amplifier including: an inverter including a pull-up transistor and a pull-down transistor; and a switching unit configured to change a connection relationship between the pull-up transistor and the pull-down transistor according to whether an input terminal of the inverter is precharged or a signal applied to the input terminal is sensed.

In an embodiment, the switching unit may diode-connect the pull-up transistor when the input terminal is precharged, and may connect in series the pull-up transistor to the pull-down transistor when the signal is sensed.

In an embodiment, in the case where the input terminal is precharged, the switching unit may release a serial connection between the pull-up transistor and the pull-down transistor, and may diode-connect the pull-up transistor.

In an embodiment, in the case where the signal is sensed, the switching unit may release a diode connection of the pull-up transistor, and may connect in series the pull-up transistor to the pull-down transistor.

In an embodiment, the pull-up transistor and the pull-down transistor may be a PMOS and an NMOS respectively, and the switching unit may include a first switch connected between a drain and a gate of the PMOS and a second switch connected between the drain of the PMOS and a drain of the NMOS.

In an embodiment, the pull-up transistor and the pull-down transistor may be a PNP-type BJT and an NPN-type BJT, and the switching unit may include a first switch connected between a collector and a base of the PNP-type BJT and a second switch connected between the collector of the PNP-type BJT and a collector of the NPN-type BJT.

In an embodiment, the first switch may be closed when the input terminal is precharged, and may be opened when the signal is sensed, and the second switch may be opened when the input terminal is precharged, and may be closed when the signal is sensed.

In an embodiment, when the input terminal is precharged, the switching unit may diode-connect the pull-up transistor so that the input terminal may be charged by as much as a voltage obtained by subtracting a threshold voltage of the pull-up transistor from a driving voltage of the inverter.

In an embodiment, the sense amplifier may further include a supplemental pull-down transistor for maintaining an output terminal of the inverter at a voltage corresponding to a logic level of 0 when the input terminal is precharged.

In an embodiment, the pull-down transistor may include an NMOS or an NPN-type BJT shunt connected to the output terminal.

In an embodiment, the NMOS or the NPN-type BJT may be turned on when the input terminal is precharged, and may be turned off when the signal is sensed.

In an embodiment, the sense amplifier may further include an additional inverter cascade connected to the output terminal of the inverter.

In an embodiment of the inventive concept, a sense amplifier includes: an inverter including a pull-up transistor configured with a PMOS and a pull-down transistor configured with an NMOS; a first switch connected between a drain and a gate of the PMOS; and a second switch connected between the drain of the PMOS and a drain of the NMOS.

In an embodiment, the first switch may be closed and the second switch may be opened when an input terminal of the inverter is precharged, and the first switch may be opened and the second switch may be closed when a signal applied to the input terminal is sensed.

In an embodiment, the sense amplifier may further include a supplemental pull-down transistor connected between the output terminal of the inverter and a power terminal having a potential corresponding to a logic level of 0.

In an embodiment, the supplemental pull-down transistor may be turned on when the input terminal of the inverter is precharged, and may be turned off when the signal applied to the input terminal is sensed.

In an embodiment, the sense amplifier may further include an additional inverter cascade connected to the output terminal of the inverter.

In an embodiment of the inventive concept, a semiconductor memory device includes: a plurality of memory elements configured to store data; and a sense amplifier connected to the memory elements to sense a signal corresponding to the data, the sense amplifier including: an inverter including a pull-up transistor and a pull-down transistor; and a switching unit configured to change a connection relationship between the pull-up transistor and the pull-down transistor according to whether an input terminal of the inverter is precharged or a signal applied to the input terminal is sensed.

In an embodiment, the memory elements may include at least one of a DRAM cell array or an SRAM cell array.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Advantages and features of the inventive concept and methods for achieving them will be clarified through the description of embodiments provided below with reference to the accompanying drawings. The inventive concept may, however, be embodied in different forms and should not be construed as being limited to the embodiments described below. Rather, these embodiments are provided so that this disclosure will be thorough and complete, and will fully convey the scope of the inventive concept to those skilled in the art, and the inventive concept is defined by the scope of claims.

The terms (including technical or scientific terms) used herein have the meanings generally accepted in the art, unless otherwise defined. The terms defined in general dictionaries may be interpreted as having the same meanings as those of the terms used in the related art and/or the present disclosure, and should not be interpreted in an idealized or overly formal sense unless otherwise defined explicitly.

The terminology used herein is not for delimiting the embodiments of the inventive concept but for describing the embodiments of the inventive concept. The terms of a singular form may include plural forms unless otherwise specified. The meaning of the term "include", "comprise", "including", "comprising", or the like used herein specifies a composition, an ingredient, a component, a step, an operation and/or an element but does not exclude other compositions, ingredients, components, steps, operations and/or elements. The term "and/or" used herein indicates each of listed elements or various combinations thereof.

According to an embodiment of the inventive concept, a precharging PMOS and a PMOS for sensing a signal, which are individually provided to a typical sense amplifier, are integrated through switching, so that malfunction or operation speed degradation of a circuit due to process variation may be overcome.

Furthermore, according to an embodiment of the inventive concept, a read bit line (RBL) is charged with a voltage lower than a driving voltage for an inverter when precharging is performed, so that an operation speed of a sense amplifier is improved and circuit malfunction due to a decrease in a precharge voltage is prevented, thereby improving the reliability of operation.

Embodiments of the inventive concept will be described in detail with reference to the accompanying drawings.

Figure 1:
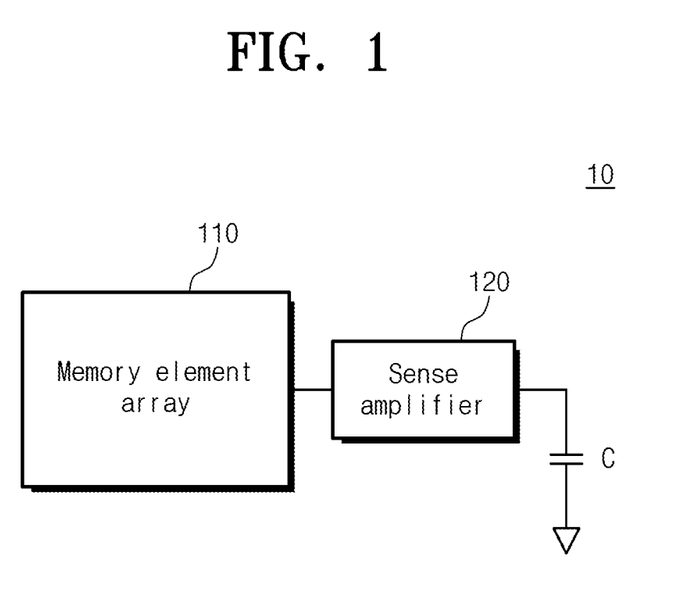
FIG. 1 is an exemplary block diagram illustrating a semiconductor memory device according to an embodiment of the inventive concept.

FIG. 1 is an exemplary block diagram illustrating a semiconductor memory device 10 according to an embodiment of the inventive concept.

As illustrated in FIG. 1, the semiconductor memory device 10 may include a memory element array 110 and a sense amplifier 120.

The memory element array 110 includes a plurality of memory elements to store data. The memory elements may be connected to a word line and a bit line so that data may be written or read therethrough.

According to an embodiment of the inventive concept, the memory elements may include a dynamic random access memory (DRAM) cell arrays for storing data using a capacitor. According to another embodiment of the inventive concept, the memory elements may include a static random access memory (SRAM) cell arrays for storing data using a latch or flip-flop. According to an embodiment of the inventive concept, the memory elements may be a complex cell array including both the DRAM cell array and the SRAM cell array, and a memory cell structure is not particularly limited if the structure enables reading and storing of data.

The sense amplifier 120 may be connected to the memory elements to sense a signal corresponding to data stored therein. The sense amplifier 120 may amplify a signal read from a memory element into a predetermined logic level to convert the signal into a logic signal such as 0 or 1. The logic signal output from the sense amplifier 120 may be applied to a predetermined storage unit such as a capacitor C.

As described above, the sense amplifier 120 according to an embodiment of the inventive concept may integrate pull-up transistors for performing precharging and sensing a signal so that malfunction or operation speed degradation of a circuit may be avoided.

Figure 2:
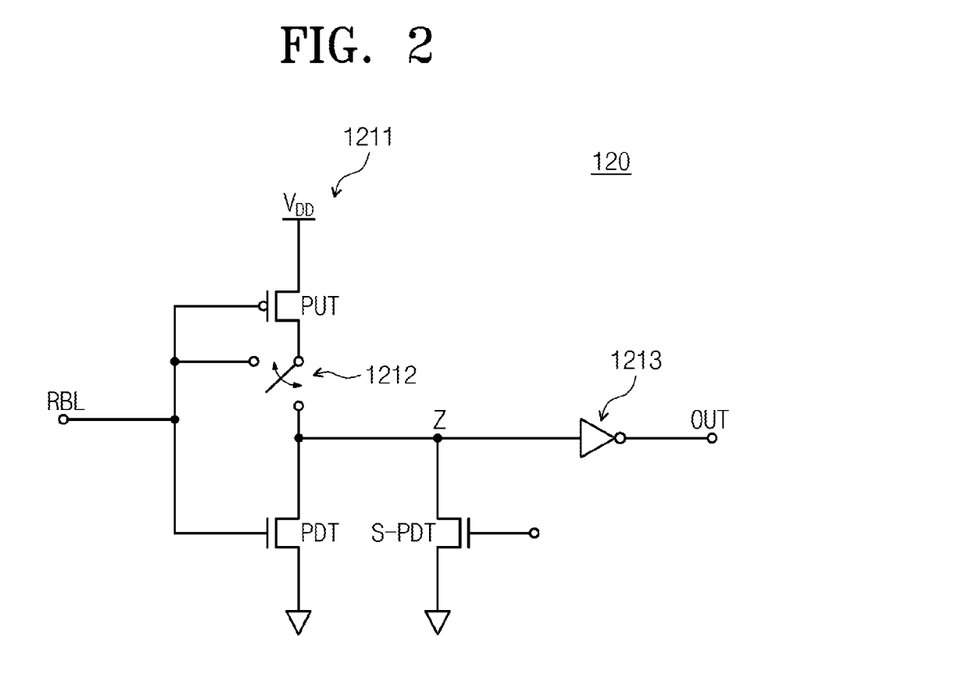
FIG. 2 is an exemplary circuit diagram illustrating a sense amplifier according to an embodiment of the inventive concept.

FIG. 2 is an exemplary circuit diagram illustrating the sense amplifier 120 according to an embodiment of the inventive concept.

As illustrated in FIG. 2, the sense amplifier 120 may include an inverter 1211 including a pull-up transistor PUT and a pull-down transistor PDT and a switching unit 1212 for changing a structure of the inverter 1211.

The switching unit 1212 may change a connection relationship, i.e., a structure, between the pull-up transistor PUT and the pull-down transistor PDT according to whether an input terminal of the inverter 1211 is precharged or a signal input to the input terminal is sensed.

According to an embodiment of the inventive concept, the switching unit 1212 may diode-connect the pull-up transistor PUT when the input terminal is precharged, or may connect in series the pull-up transistor PUT to the pull-down transistor PDT when the signal is sensed.

Figure 3:
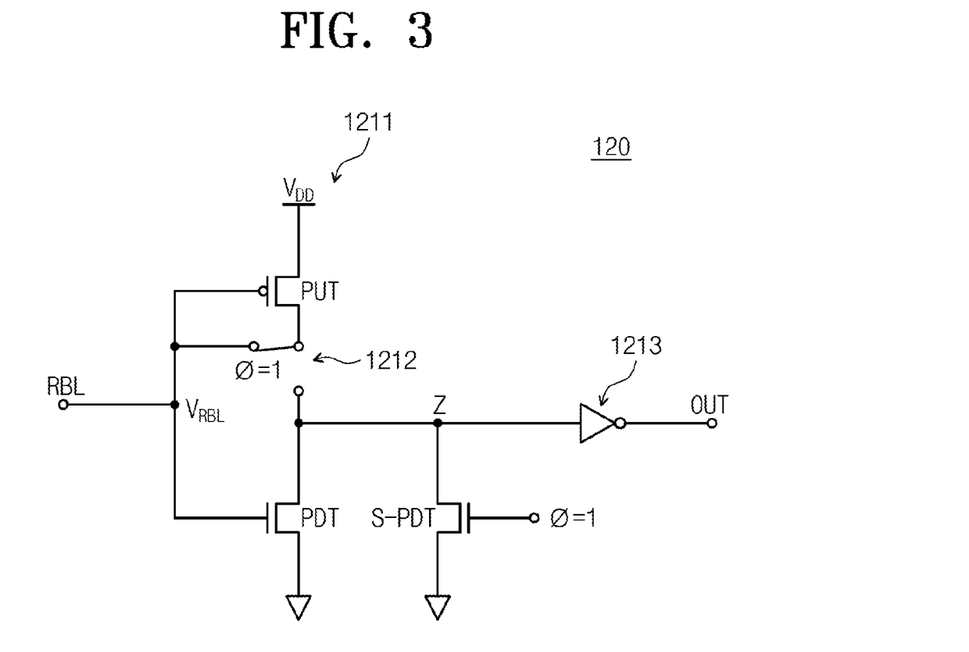
FIG. 3 is an exemplary circuit diagram illustrating a sense amplifier operating in a precharge mode according to an embodiment of the inventive concept.
Figure 4:
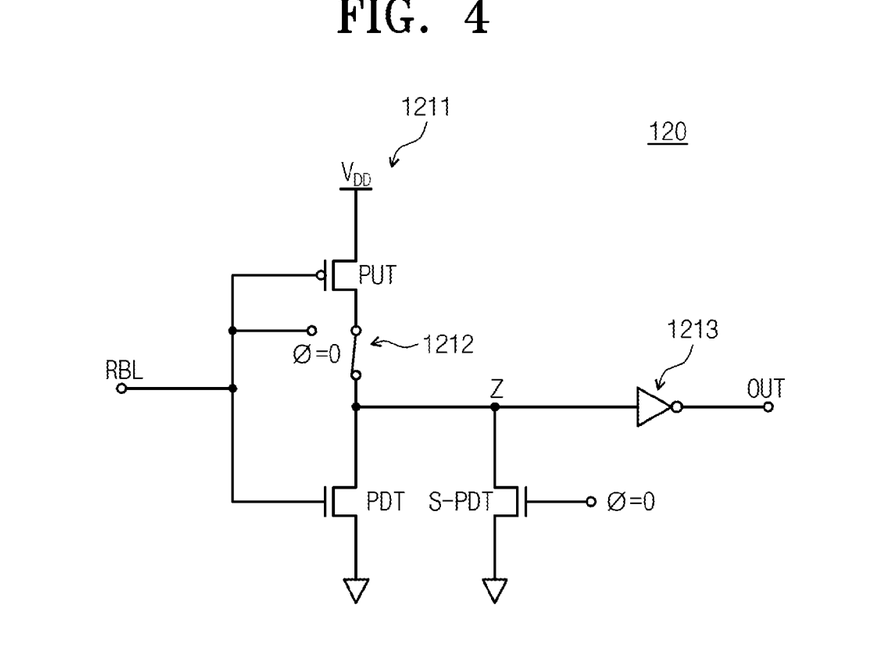
FIG. 4 is an exemplary circuit diagram illustrating a sense amplifier operating in a signal sensing mode according to an embodiment of the inventive concept.

FIG. 3 is an exemplary circuit diagram illustrating the sense amplifier 120 operating in a precharge mode according to an embodiment of the inventive concept, and FIG. 4 is an exemplary circuit diagram illustrating the sense amplifier 120 operating in a signal sensing mode according to an embodiment of the inventive concept.

Referring to FIG. 3, in the case where an RBL corresponding to the input terminal of the inverter 1211 is precharged ($\phi$=1), the switching unit 1212 may release the serial connection between the pull-up transistor PUT and the pull-down transistor PDT and may diode-connect the pull-up transistor PUT.

In other words, in the precharge mode ($\phi$=1), the switching unit 1212 may short-circuit a drain and a gate of the pull-up transistor PUT while disconnecting the pull-up transistor PUT of the inverter 1211 from the pull-down transistor PDT.

As a result, the RBL corresponding to the input terminal may be charged with a voltage lower than a driving voltage $V_{DD}$ for the inverter 1211, i.e., $V_{DD}-V_{th,PUT}$, so that a voltage $V_{RBL}$ of the RBL may be lower than the voltage $V_{DD}$ which is a precharge voltage for a typical sense amplifier by as much as a threshold voltage $V_{th,PUT}$ of the pull-up transistor PUT.

Furthermore, referring to FIG. 4, in the case where the signal applied to the input terminal is sensed ($\phi$=0), the switching unit 1212 may release the diode-connection of the pull-up transistor PUT and may connect in series the pull-up transistor PUT to the pull-down transistor PDT.

In other words, in the signal sensing mode ($\phi$=0), the switching unit 1212 may configure the inverter 1211 by connecting in series the pull-up transistor PUT to the pull-down transistor PDT while releasing the connection between the drain and the gate of the pull-up transistor PUT.

In the case where a data signal applied through the RBL corresponds to a logic level of 1 the pull-down transistor PDT from among the pull-up transistor PUT and the pull-down transistor PDT included in the inverter 1211 is turned on and the pull-up transistor PUT is turned off, so that an output terminal of the inverter 1211 may output a signal corresponding to a logic level of 0.

In the case where the data signal applied through the RBL corresponds to the logic level of 0, the RBL starts to be discharged in a state of being precharged and the voltage thereof is decreased from $V_{RBL}=V_{DD}-V_{th,PUT}$ to a voltage (e.g., 0) corresponding to the logic level of 0. As a result, the pull-up transistor PUT from among the pull-up transistor PUT and the pull-down transistor PDT included in the inverter 1211 is turned on and the pull-down transistor PDT is turned off, so that the output terminal of the inverter 1211 may be charged with a voltage (i.e., $V_{DD}$) corresponding to the logic level of 1.

In general, an operation speed of a sense amplifier is determined by a time taken for the precharged RBL to be discharged to a voltage corresponding to the logic level of 0 in the case where the data signal corresponding to the logic level of 0 is applied to the RBL. As a discharge time of the RBL decreases, the operation speed of the sense amplifier increases.

According to an embodiment of the inventive concept, in the precharge mode ($\phi$=1), the pull-up transistor PUT is diode-connected so that the RBL is charged with a voltage which is lower than the driving voltage $V_{DD}$ for the inverter 1211 by the threshold voltage $V_{th,PUT}$ of the pull-up transistor PUT. Therefore, the discharge time of the RBL is shortened compared to that of a typical sense amplifier in which the RBL is charged with the driving voltage $V_{DD}$, and thus the operation speed of the sense amplifier may be improved.

Furthermore, according to an embodiment of the inventive concept, a precharging pull-up transistor and a pull-up transistor for sensing a signal, which are individually provided in a typical sense amplifier, are integrated through switching. Therefore, malfunction caused by a threshold voltage difference between the pull-up transistors due to process variation may be prevented.

Figure 5:
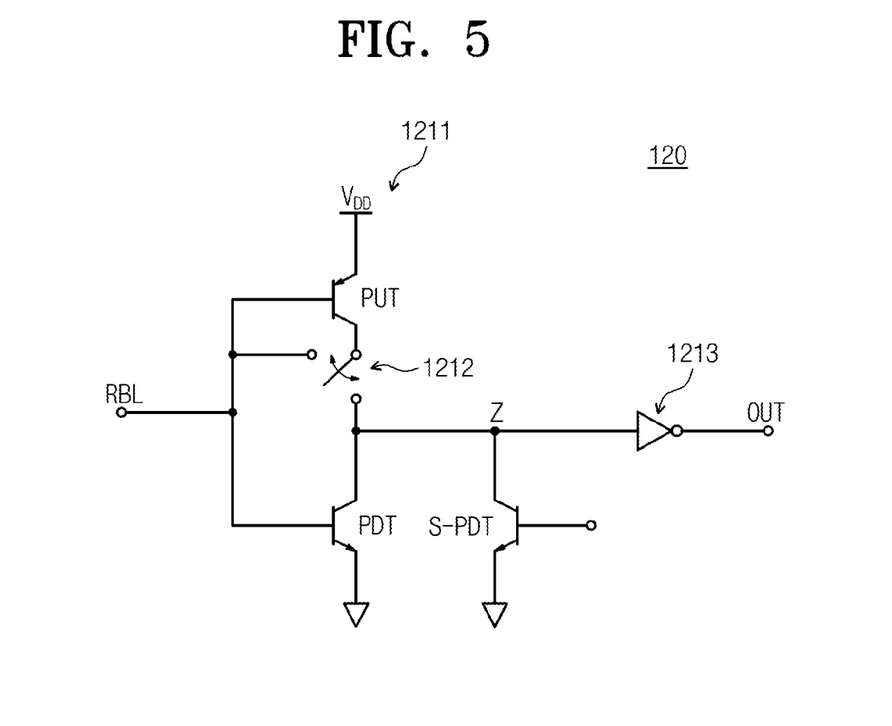
FIG. 5 is an exemplary circuit diagram illustrating a sense amplifier configured with a BJT according to an embodiment of the inventive concept.

According to an embodiment of the inventive concept, as illustrated in FIG. 2, the pull-up transistor PUT and the pull-down transistor PDT may be a p-type metal oxide semiconductor (PMOS) and an n-type metal oxide semiconductor (NMOS) respectively. However, according to another embodiment of the inventive concept, as illustrated in FIG. 5, the pull-up transistor PUT and the pull-down transistor PDT may be a PNP-type bipolar junction transistor (BJT) and an NPN-type BJT respectively. Any semiconductor device capable of performing a signal pull-up or pull-down function may be used as the pull-up transistor PUT or the pull-down transistor PDT.

According to an embodiment of the inventive concept, the switching unit 1212 may include a first switch connected between the drain and the gate of the pull-up transistor PUT and a second switch connected between the drain of the pull-up transistor PUT and a drain of the pull-down transistor PDT.

Figure 6:
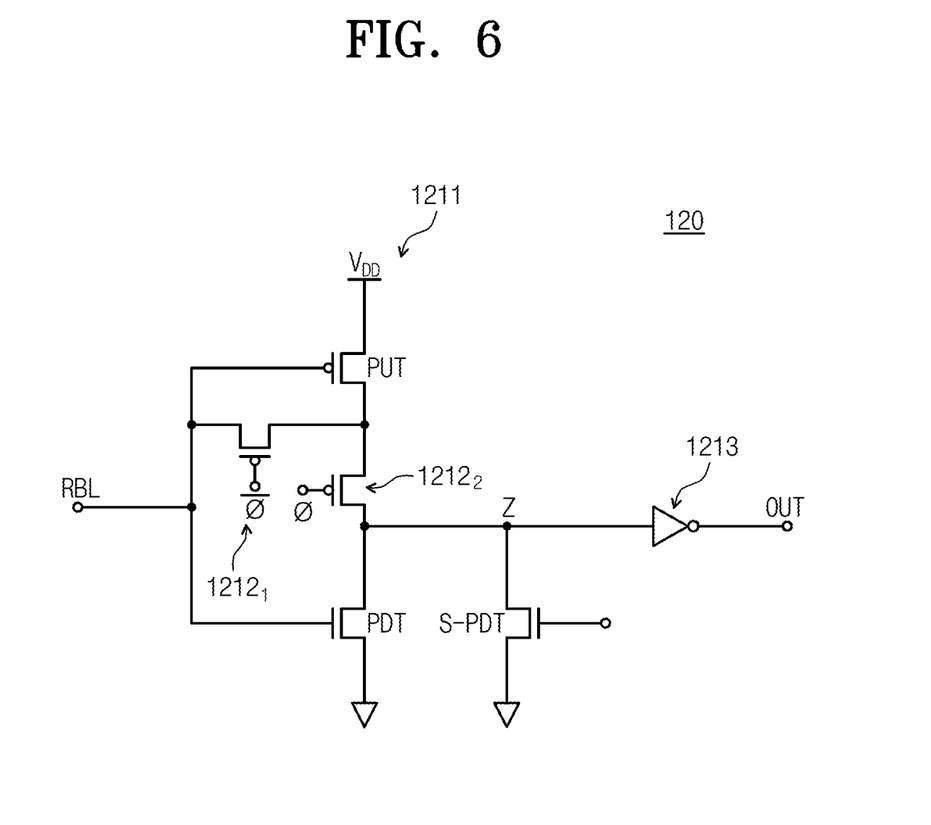
FIG. 6 is an exemplary circuit diagram illustrating a sense amplifier in which first and second switches are implemented with PMOSs according to an embodiment of the inventive concept.

FIG. 6 is an exemplary circuit diagram illustrating the sense amplifier 120 in which the first and second switches are implemented with PMOSs according to an embodiment of the inventive concept.

As illustrated in FIG. 6, a first switch $1212_1$ may be a PMOS connected between the drain and the gate of the pull-up transistor PUT that is a PMOS and a second switch $1212_2$ may be a PMOS connected between the drain of the pull-up transistor PUT and the drain of the pull-down transistor PDT that is an NMOS.

The first and second switches $1212_1$ and $1212_2$ may be turned on or off in response to a clock signal $\phi$ for determining an operation of the sense amplifier 120 so as to change the connection structure between the pull-up transistor PUT and the pull-down transistor PDT. In the example illustrated in FIG. 6, when the sense amplifier 120 precharges the RBL, the clock signal $\phi$=1, and, when the sense amplifier 120 senses a signal applied to the RBL, the clock signal $\phi$=0.

As a result, the first switch $1212_1$ may be closed at a time of precharge ($\phi$=1) and may be opened at a time of sensing a signal ($\phi$=0), and the second switch $1212_2$ may be opened at the time of precharge ($\phi$=1) and may be closed at the time of sensing a signal ($\phi$=0).

The first and second switches $1212_1$ and $1212_2$ are not limited to the above-mentioned configuration, and may include any switching element (e.g., an NMOT, a BJT, or the like) of which opening/closing is controlled by the clock signal $\phi$. For example, as illustrated in FIG. 5, in the case where the inverter 1211 is configured with BJTs, the first switch $1212_1$ may be a PNP-type BJT connected between a collector and a base of the pull-up transistor PUT and the second switch $1212_2$ may be a PNP-type BJT connected between the collector of the pull-up transistor PUT and a collector of the pull-down transistor PDT.

According to an embodiment of the inventive concept, the sense amplifier 120 may further include a supplemental pull-down transistor S-PDT for maintaining an output terminal Z of the inverter 1211 at a voltage corresponding to the logic level of 0 when the input terminal of the sense amplifier 120 is precharged.

For example, referring to FIGS. 2 and 5, the sense amplifier 120 may further include an NMOS or an NPN-type BJT as the supplemental pull-down transistor S-PDT between the output terminal Z of the inverter 1211 and a power terminal having a potential (e.g., ground potential) corresponding to the logic level of 0. Opening/closing of the supplemental pull-down transistor S-PDT may be controlled by the clock signal φ for determining an operation of the sense amplifier 120.

As a result, the supplemental pull-down transistor S-PDT is turned on in the precharge mode (φ=1) so that the output terminal Z of the inverter 1211 may be maintained at a voltage corresponding to the logic level of 0, i.e., the ground potential, and is turned off in the signal sensing mode (φ=0) so that the output terminal Z may output an inverted signal of the data signal input through the RBL.

The supplemental pull-down transistor S-PDT may prepare for the case in which the output voltage Z of the inverter 1211 is not maintained at the potential corresponding to the logic level of 0 since the pull-down transistor PDT is not turned on due to a decrease in a precharge voltage of the RBL.

According to an embodiment of the inventive concept, the sense amplifier 120 may further include an additional inverter 1213 cascade-connected to the output terminal Z of the inverter 1211. Since the additional inverter 1213 inverts a signal output from the inverter 1211, the additional inverter 1213 outputs a signal having the same logic level as that of the data signal input through the RBL.

Figure 7:
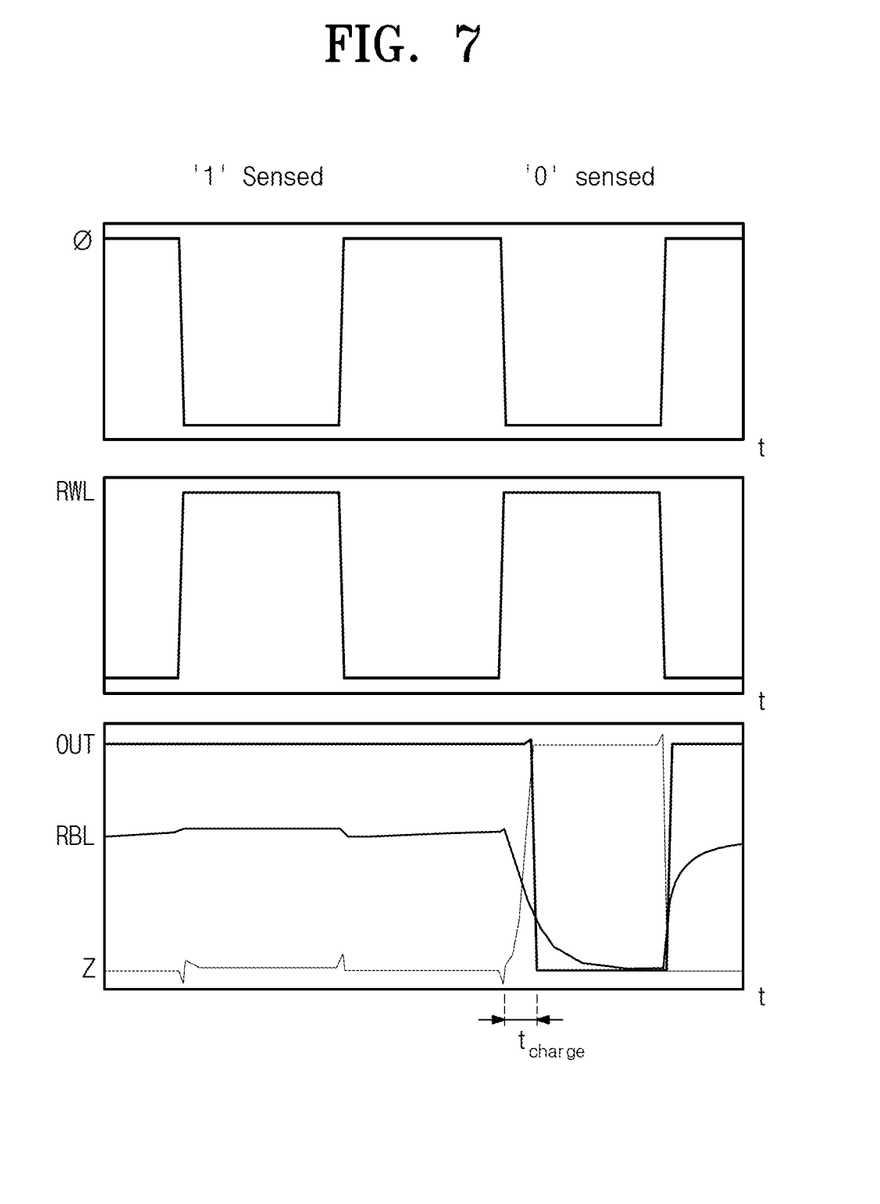
FIG. 7 is an exemplary diagram illustrating voltage waveforms of an operation mode of a sense amplifier, a read word line (RWL), an input terminal and an output terminal of an inverter, and an output terminal of the sense amplifier according to an embodiment of the inventive concept.

FIG. 7 is an exemplary diagram illustrating voltage waveforms of an operation mode φ of the sense amplifier 120, a read word line (RWL), the input terminal RBL and the output terminal Z of the inverter 1211, and an output terminal OUT of the sense amplifier 120 according to an embodiment of the inventive concept.

As shown in FIG. 7, in the case where the sense amplifier 120 is operated in the precharge mode (φ=1), the input terminal RBL of the inverter 1211 is charged with a voltage lower than the voltage VDD corresponding to the logic level of 1 (i.e., a voltage of the output terminal OUT of the sense amplifier 120). Here, the output terminal Z of the inverter 1211 has a potential corresponding to the logic level of 0, and the output terminal OUT of the sense amplifier 120 has a potential corresponding to the logic level of 1.

Furthermore, in the case where a signal corresponding to the logic level of 1 is sensed in the signal sensing mode (φ=0), the voltage of the input terminal RBL is maintained without being changed so that the output terminal Z of the inverter 1211 and the output terminal OUT of the sense amplifier 120 have potentials corresponding to the logic level of 0 and the logic level of 1 respectively.

On the contrary, in the case where a signal corresponding to the logic level of 0 is sensed in the signal sensing mode (φ=0), the voltage of the input terminal RBL starts to be discharged so that the output terminal Z of the inverter 1211 is charged with a potential corresponding to the logic level of 1 via the pull-up transistor PUT and the output terminal OUT of the sense amplifier 120 has a potential corresponding to the logic level of 0.

As described above, according to an embodiment of the inventive concept, since the input terminal RBL is precharged with a voltage lower than the driving voltage $V_{DD}$, the input terminal RBL is discharged when a signal corresponding to the logic level of 0 is sensed, so that a time $t_{charge}$ taken for the output terminal Z to be charged with a potential corresponding to the logic level of 1 decreases, thereby improving the operation speed of the sense amplifier 120.

According to an embodiment of the inventive concept, operation speed degradation and malfunction of a circuit due to process variation may be prevented.

According to an embodiment of the inventive concept, an operation speed may be improved by charging an RBL of a memory with a voltage lower than a driving voltage for an inverter, but malfunction that may occur due to the low voltage may be prevented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A sense amplifier comprising:
    an inverter including a pull-up transistor and a pull-down transistor; and
    a switching unit configured to change a connection relationship between the pull-up transistor and the pull-down transistor according to a precharging of an input terminal of the inverter or a sensing of a signal applied to the input terminal,
    wherein the switching unit is configured to,
        release a serial connection between the pull-up transistor and the pull-down transistor when the input terminal is precharged, and
        connect the pull-up transistor and the pull-down transistor in series when the signal is applied to the input terminal.

2. The sense amplifier of claim 1, wherein the switching unit is configured to,
    diode-connect the pull-up transistor when the input terminal is precharged, and
    connect in series the pull-up transistor to the pull-down transistor when the signal is sensed.

3. The sense amplifier of claim 2, wherein, when the input terminal is precharged, the switching unit is configured to release the serial connection between the pull-up transistor and the pull-down transistor, and diode-connect the pull-up transistor.

4. The sense amplifier of claim 2, wherein, when the signal is sensed, the switching unit is configured to release a diode connection of the pull-up transistor, and connect in series the pull-up transistor to the pull-down transistor.

5. The sense amplifier of claim 1, wherein
    the pull-up transistor and the pull-down transistor are a p-type metal oxide semiconductor (PMOS) and an n-type metal oxide semiconductor (NMOS) respectively, and
    the switching unit includes,
        a first switch connected between a drain and a gate of the PMOS; and
        a second switch connected between the drain of the PMOS and a drain of the NMOS.

6. The sense amplifier of claim 1, wherein
    the pull-up transistor and the pull-down transistor are a PNP-type bipolar junction transistor (BJT) and an NPN-type BJT, and the switching unit includes,
a first switch connected between a collector and a base of the PNP-type BJT; and
a second switch connected between the collector of the PNP-type BJT and a collector of the NPN-type WT.

7. The sense amplifier of claim 5, wherein
the first switch is closed when the input terminal is precharged,
the first switch is opened when the signal is sensed,
the second switch is opened when the input terminal is precharged, and
the second switch is closed when the signal is sensed.

8. The sense amplifier of claim 6, wherein
the first switch is closed when the input terminal is precharged,
the first switch is opened when the signal is sensed,
the second switch is opened when the input terminal is precharged, and
the second switch is closed when the signal is sensed.

9. The sense amplifier of claim 1, wherein, when the input terminal is precharged, the switching unit is configured to diode-connect the pull-up transistor so that the input terminal is charged by as much as a voltage obtained by subtracting a threshold voltage of the pull-up transistor from a driving voltage of the inverter.

10. The sense amplifier of claim 1, further comprising:
an additional inverter cascade connected to an output terminal of the inverter.

11. A sense amplifier comprising:
an inverter including a pull-up transistor and a pull-down transistor;
a switching unit configured to change a connection relationship between the pull-up transistor and the pull-down transistor according to a precharging of an input terminal of the inverter or a sensing of a signal applied to the input terminal; and
a supplemental pull-down transistor configured to maintain an output terminal of the inverter at a voltage corresponding to a logic level of 0 when the input terminal is precharged.

12. The sense amplifier of claim 11, wherein the pull-down transistor comprises an n-type metal oxide semiconductor (NMOS) or an NPN-type bipolar junction transistor (BJT) shunt connected to the output terminal.

13. The sense amplifier of claim 12, wherein
the NMOS or the NPN-type BJT is turned on when the input terminal is precharged, and
the NMOS or the NPN-type BJT is turned off when the signal is sensed.

14. A sense amplifier comprising:
an inverter including a pull-up transistor configured with a p-type metal oxide semiconductor (PMOS) and a pull-down transistor configured with an n-type metal oxide semiconductor (NMOS);
a first switch connected between a drain and a gate of the PMOS; and
a second switch connected between the drain of the PMOS and a drain of the NMOS, wherein
the first switch is configured to be closed and the second switch is configured to be opened when an input terminal of the inverter is precharged, and
the first switch is configured to be opened and the second switch is configured to be closed when a signal applied to the input terminal is sensed.

15. The sense amplifier of claim 14, further comprising:
an additional inverter cascade connected to an output terminal of the inverter.

16. A sense amplifier comprising:
an inverter including a pull-up transistor configured with a p-type metal oxide semiconductor (PMOS) and a pull-down transistor with an n-type metal oxide semiconductor (NMOS);
a first switch connected between a drain and a gate of the PMOS;
a second switch connected between the drain of the PMOS and a drain of the NMOS; and
a supplemental pull-down transistor connected between an output terminal of the inverter and a power terminal having a potential corresponding to a logic level of 0.

17. The sense amplifier of claim 16, wherein
the supplemental pull-down transistor is turned on when an input terminal of the inverter is precharged, and
the supplemental pull-down transistor is turned off when a signal applied to the input terminal is sensed.

18. A semiconductor memory device comprising:
a plurality of memory elements configured to store data; and
a sense amplifier connected to the memory elements and configured to sense a signal corresponding to the data, the sense amplifier including,
an inverter including a pull-up transistor and a pull-down transistor; and
a switching unit configured to change a connection relationship between the pull-up transistor and the pull-down transistor according to a precharging of an input terminal of the inverter or a sensing of a signal applied to the input terminal,
wherein the switching unit is configured to,
release a serial connection between the pull-up transistor and the pull-down transistor when the input terminal is precharged, and
connect the pull-up transistor and the pull-down transistor in series when the signal is applied to the input terminal.

19. The semiconductor memory device of claim 18, wherein the memory elements comprise at least one of a dynamic random access memory (DRAM) cell array or a static random access memory (SRAM) cell array.

* * * * *